United States Patent [19]

Chen et al.

[11] 4,080,488
[45] Mar. 21, 1978

[54] DYE-TITANIUM DIOXIDE PHOTOGALVANIC CELL

[75] Inventors: Schoen-Nan Chen, North Brunswick; Satyendra K. Deb, East Brunswick; Horst Witzke, Princeton, all of N.J.

[73] Assignees: Optel Corporation, Princeton, N.J.; Grumman Aerospace Corporation, Bethpage, N.Y.; part interest to each

[21] Appl. No.: 740,876

[22] Filed: Nov. 11, 1976

[51] Int. Cl.$^2$ .................. H01M 6/30; H01M 6/36
[52] U.S. Cl. ................................................. 429/111
[58] Field of Search .................. 136/89 NB; 429/111

[56] References Cited

U.S. PATENT DOCUMENTS

| | | | |
|---|---|---|---|
| 3,989,542 | 11/1976 | Clark | 136/89 NB |
| 4,037,029 | 7/1977 | Anderson | 429/111 |

OTHER PUBLICATIONS

H. Gerischer et al. "Photoelektrochemische Prozesse und Photokatalyse an Zinkoxid-Suspensionen und Zinkoxid-Deckschichten" *Ber. Bunsen Gesell*, vol. 76, pp. 385-388 (1972).
J. R. Bolton, "Photochemical Storage of Solar Energy by the Dye Sensitized Photolysis of Water", Proc. VIII Int'l Conf. on Photochem, Edmonton, Canada, Aug. 1975.
A. J. Nozik "Photoelectrolysis of Water Using Semiconducting TiO$_2$ Crystals", Nature, vol. 257, pp. 383-386, Oct. 1975.
R. Gomer, "Photogalvanic Cells", *Electrochimica Acta*, vol. 20, pp. 13-20, (1975).

*Primary Examiner*—John H. Mack
*Assistant Examiner*—Aaron Weisstuch
*Attorney, Agent, or Firm*—Morris Liss

[57] ABSTRACT

A photogalvanic cell has a glass substrate through which irradiating light passes. A light transparent conductive thin film serves as an electrode, the film being deposited upon the glass substrate. Another layer is an electrolyte and includes an aqueous medium having TiO$_2$ suspended therein, the TiO$_2$ forming photoactive sites with the remaining ingredients of the electrolyte. The electrolyte layer further includes N-methylphenazine methosulfate dye which has photoconversion and electrical storage properties. During irradiation the cell may drive a load, or stored energy resulting from irradiation may drive a load after the source of irradiation is removed.

6 Claims, 2 Drawing Figures

PRIOR ART

DYE-TITANIUM DIOXIDE PHOTOGALVANIC CELL

FIELD OF THE INVENTION

The present invention relates to photogalvanic cells and more particularly to a photogalvanic cell having $TiO_2$ and a dye system included in an electrolyte layer for converting light to electrical energy and also for storing electrical energy after irradiation.

BRIEF DESCRIPTION OF THE PRIOR ART

The prior art includes photogalvanic cells relying upon a $TiO_2$-electrolyte interface for constituting a photoactive site which converts irradiating light energy to electrical energy. In copending U.S. patent application Ser. No. 582,344, there is brief mention to the possibility of using a dye system in a photogalvanic cell. This is mentioned on page 6, line 21, of the referenced copending application. Although the usefulness of the dye system in a photogalvanic cell was theorized, the application of specific dyes was not envisioned by that invention.

In a published paper in *Proceedings VIII International Conference on Photochemistry*, Edmonton, Canada, August, 1975, by James R. Bolton, entitled "Photochemical Storage of Solar Energy by the Dye Sensitized Photolysis of Water" use of the particular dye, relied upon by the present invention, is recognized. In FIG. 1, the embodiment disclosed by Bolton is illustrated. In the left-hand compartment, a dye D (which should be a good donor in the ground state) will be excited by light so that the excited state D* is able to reduce water to hydrogen leaving the oxidized dye D+. In the right-hand compartment, a dye A (which should be a good acceptor in the ground state) will be excited by light so that A* will be able to oxidize water to oxygen leaving the reduced dye $A^-$. The two compartments are then coupled together electrochemically so that $A^-$ can spontaneously reduce $D^+$ thus restoring the dyes to their original states. The dark reactions following the photochemical electron transfers may be rather complex and specific catalysts capable of storing electrochemical equivalents will be required. Bolton discovered a reaction which partially meets the requirements for the dye A. The dye is the N-methylphenazinium cation ($NMP^+$). At wavelengths less than 500 nm $NMP^+$ is able to photooxidize water yielding the reduced dye $NMPH^+$ and .OH radicals.

Although the Bolton concept recognized the particular dye utilized in the present invention, his structure was directed to a multi-compartment cell for achieving photolysis of water and there is a complete absence of a metal oxide such as $TiO_2$ which is capable of performing photoconversion at a photoactive junction with an electrolyte, as is achieved by the present invention.

In a second co-pending application entitled "N-Methylphenazine Photogalvanic Cell" by Schoen-nan Chen, Ser. No. 740,875 filed Nov. 11, 1976 assigned to the present assignee, a photogalvanic cell is disclosed which utilizes the particular dye of this invention. However, the photocell of the second co-pending application is a relatively simple structure including an electrode and counterelectrode which contact the above mentioned dye system. The dye system is capable of achieving photoconversion and electrical energy storage. However, the photocell of the second co-pending application does not recognize the advantage of adding $TiO_2$ to the cell to increase photoconversion efficiency.

BRIEF DESCRIPTION OF THE PRESENT INVENTION

The present invention is a distinct improvement over the prior art. Although no single component of the present invention is unique, the inclusion of a $TiO_2$ pigment in an aqueous electrolyte medium, along with N-methylphenazine methosulfate achieves an unexpectedly high photoconversion efficiency accompanied by electrical charge storage. Indeed, the N-methylphenazinium ion extends the spectral response of $TiO_2$ photogalvanic cells to 500 nm, thus enabling this improved cell to make fuller use of the solar spectrum.

The above-mentioned objects and advantages of the present invention will be more clearly understood when considered in conjunction with the accompanying drawings, in which:

DETAILED DESCRIPTION OF THE INVENTION

Figure 1:
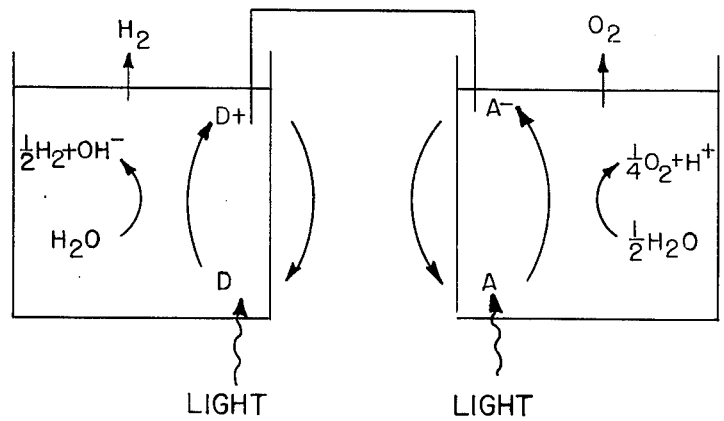
FIG. 1 is a diagrammatic representation of a dual compartment cell as disclosed in the above mentioned prior art.
Figure 2:
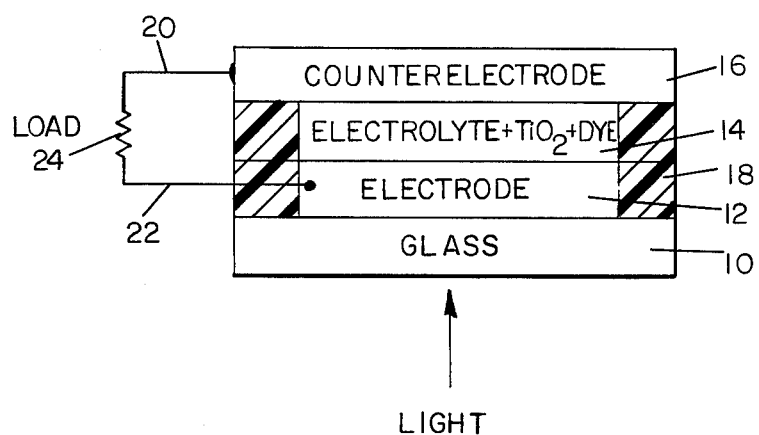
FIG. 2 is a diagrammatic cross sectional view of the photogalvanic cell which constitutes the present invention.

Referring to the figures, a light transparent substrate 10 admits irradiating light to the remaining photogalvanic cell structure. A layer of transparent conducting material is deposited on the glass substrate 10 to form a thin film electrode 12. Typically, a suitable conducting material will be $SnO_2$.

As illustrated, an electrolyte 14 layer is deposited on the electrode 12. Typically, the electrolyte may be neutral or acidic. In order to create a first photoconversion mechanism, a suitable photoactive material is mixed with the aqueous solution. A suitable material is $TiO_2$ pigment powder, preferably in the anatase form but which may also be in the rutile form. The junction between each $TiO_2$ particle and the electrolyte forms a photoactive site. The electrolyte 14 may also include a suspending agent for the $TiO_2$ pigment particles, such as glycerine.

In addition to the photoactive $TiO_2$ in the electrolyte 14, a dye system is added to the electrolyte to broaden the radiation frequencies to which the present cell will respond. The dye system to which the present invention is directed relies upon the N-methylphenazinium ion to extend the spectral response of $TiO_2$ in the photogalvanic cell from the anticipated ultraviolet region up to 500 nm., thus enabling the present photogalvanic cell to be more responsive to the solar spectrum. The dye is commercially available as N-methylphenazine methosulfate, available from the Eastman Kodak Company.

The illustrated upper surface of the electrolyte 14 is bounded by a counterelectrode 16, which may be fabricated from a carbon disc or platinized carbon disc.

In order to seal the cell and insulate the electrode 12 from the counterelectrode 16, a wall 18 is transversely fixed between the glass substrate 10 and the counterelectrode 16. The wall 18 may be fabricated from a suitable inner insulative material such as epoxy.

Wires 20 and 22 are respectively bonded to the counterelectrode 16 and the electrode 12. A load diagrammatically illustrated at 24 is connected between these wires. During continued irradiation to a light source, the load 24 will draw current. However, if the photogalvanic cell is to store energy, the load 24 may be removed from its connection while the cell is irradiated. The dye system will achieve energy storage so that when the irradiating source is removed, the load may be connected and draw the stored electrical energy.

With respect to the composition of the electrolyte, it may include the aqueous solution of two parts $H_2SO_4$ and one part $H_2O$, by volume. Eight parts of glycerine will be sufficient to suspend the $TiO_2$ in the electrolyte. The addition of approximately 0.2 M of N-methylphenazine methosulfate powder to this electrolyte composition will result in the necessary electrical charge storage and additional photoconversion which this particular dye is capable of achieving.

It should be understood that the invention is not limited to the exact details of construction shown and described herein for obvious modifications will occur to persons skilled in the art.

We claim the following:

1. A photogalvanic cell comprising:
    a light transparent electrode;
    a counterelectrode located in spaced relation to the electrode;
    an electrolyte located between the electrode and counterelectrode;
    a dye comprising N-methylphenazinium ions dissolved in the electrolyte for converting irradiating light energy to electrical energy as well as for storing electrical energy; and
    titanium dioxide suspended in the electrolyte for coacting with the electrolyte to form photoactive sites which convert light energy to electrical energy.

2. The subject matter set forth in claim 1 together with means respectively connected to the electrode and counterelectrode for transferring electrical energy from the cell to an externally connected load.

3. The subject matter set forth in claim 2 together with a supportive transparent substrate upon which the electrode is deposited.

4. The subject matter set forth in claim 3 together with a wall surrounding the electrolyte and transversely located between the electrode and counterelectrode for sealing the electrolyte within the cell and for supporting the electrode and counterelectrode in insulated spaced relation.

5. The subject matter set forth in claim 1 together with a supportive transparent substrate upon which the electrode is deposited.

6. The subject matter set forth in claim 1 together with a wall surrounding the electrolyte and transversely located between the electrode and counterelectrode for sealing the electrolyte within the cell and for supporting the electrode and counterelectrode in insulated spaced relation.

* * * * *